(12) United States Patent
Bandholz et al.

(10) Patent No.: US 8,306,652 B2
(45) Date of Patent: Nov. 6, 2012

(54) DUAL-BAND COMMUNICATION OF MANAGEMENT TRAFFIC IN A BLADE SERVER SYSTEM

(75) Inventors: Justin Potok Bandholz, Cary, NC (US); Clifton Ehrich Kerr, Durham, NC (US); Pravin Patel, Cary, NC (US); Bruce James Wilkie, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 846 days.

(21) Appl. No.: 12/048,624

(22) Filed: Mar. 14, 2008

(65) Prior Publication Data

US 2009/0234936 A1 Sep. 17, 2009

(51) Int. Cl.
*G06F 15/173* (2006.01)
*G06F 15/16* (2006.01)

(52) U.S. Cl. ........ 700/223; 709/203; 709/208; 709/209; 709/210; 709/211; 709/223; 709/225; 709/226; 709/238; 709/245; 709/201; 709/220; 709/221; 709/222; 713/322; 713/323; 713/400; 713/600; 361/724; 361/728; 361/729; 361/730; 361/731; 361/732; 361/733; 361/734; 361/735

(58) Field of Classification Search ............ 709/203, 709/208, 209, 210, 211, 223, 225, 226, 201, 709/220, 221, 222, 238, 245; 713/322, 323, 713/400, 600; 361/724, 728, 729, 730, 731, 361/732, 733, 734, 735

See application file for complete search history.

(56) References Cited

U.S. PATENT DOCUMENTS

| | | | |
|---|---|---|---|
| 3,636,257 A * | 1/1972 | Dixon | 375/272 |
| 6,108,695 A * | 8/2000 | Chawla | 709/217 |
| 6,172,611 B1 * | 1/2001 | Hussain et al. | 340/584 |
| 6,348,837 B1 * | 2/2002 | Ibelings | 330/126 |
| 6,385,203 B2 * | 5/2002 | McHale et al. | 370/401 |
| 6,693,917 B1 * | 2/2004 | Feldman et al. | 370/488 |
| 6,771,499 B2 * | 8/2004 | Crippen et al. | 361/679.48 |
| 6,859,882 B2 * | 2/2005 | Fung | 713/300 |
| 6,976,112 B2 * | 12/2005 | Franke et al. | 710/302 |
| 7,013,352 B2 * | 3/2006 | Garnett | 710/1 |
| 7,054,163 B2 * | 5/2006 | Coffey | 361/796 |
| 7,134,011 B2 * | 11/2006 | Fung | 713/100 |
| 7,138,733 B2 * | 11/2006 | Sanders et al. | 307/147 |
| 7,193,847 B2 * | 3/2007 | Liang et al. | 361/679.48 |
| 7,200,150 B2 * | 4/2007 | Lewis | 370/401 |
| 7,236,370 B2 * | 6/2007 | Coglitore et al. | 361/724 |
| 7,302,593 B2 * | 11/2007 | Rothman et al. | 713/300 |
| 7,327,563 B2 * | 2/2008 | Cauthron | 361/679.55 |
| 7,398,401 B2 * | 7/2008 | Goud et al. | 713/300 |

(Continued)

*Primary Examiner* — John Follansbee
*Assistant Examiner* — Saket K Daftuar
(74) *Attorney, Agent, or Firm* — Cynthia G. Seal; Jeffrey L. Streets

(57) ABSTRACT

In one embodiment, a communication system for a multi-blade server system includes a multi-drop serial bus network interconnecting a management module with each of a plurality of servers in a multi-server chassis. A first transceiver subsystem is configured for communicating over the serial bus network between the management module and each server within a first frequency band. A second transceiver subsystem is configured for simultaneously communicating over the serial bus network between the management module and the servers within a second frequency band higher than the first frequency band. A first signal-filtering subsystem substantially filters out signals in the second frequency band from the first transceiver subsystem. A second signal-filtering subsystem substantially filters out the signals in the first frequency band from the second transceiver subsystem.

16 Claims, 2 Drawing Sheets

U.S. PATENT DOCUMENTS

| | | | |
|---|---|---|---|
| 7,423,870 B2 * | 9/2008 | Carlisi et al. | 361/679.41 |
| 7,487,283 B2 * | 2/2009 | Sivertsen | 710/306 |
| 7,542,812 B2 * | 6/2009 | Stroili et al. | 700/90 |
| 7,549,917 B2 * | 6/2009 | Henry et al. | 454/184 |
| 7,558,973 B2 * | 7/2009 | Huang | 713/300 |
| 7,570,484 B1 * | 8/2009 | Sivertsen | 361/679.37 |
| 7,583,639 B2 * | 9/2009 | Mahany | 370/335 |
| 7,619,897 B2 * | 11/2009 | Della Fiora et al. | 361/724 |
| 7,627,780 B2 * | 12/2009 | Davies | 714/13 |
| 7,639,486 B2 * | 12/2009 | Champion et al. | 361/679.32 |
| 7,707,437 B2 * | 4/2010 | Berenbaum et al. | 713/300 |
| 7,873,750 B2 * | 1/2011 | Yabuta et al. | 709/250 |
| 7,966,379 B2 * | 6/2011 | Berenbaum et al. | 709/208 |
| 2001/0043568 A1 * | 11/2001 | McHale et al. | 370/254 |
| 2002/0188718 A1 * | 12/2002 | McGraw et al. | 709/224 |
| 2003/0066082 A1 * | 4/2003 | Kliger et al. | 725/80 |
| 2003/0200345 A1 * | 10/2003 | Ramsey et al. | 709/253 |
| 2004/0057216 A1 * | 3/2004 | Smith et al. | 361/724 |
| 2004/0174843 A1 * | 9/2004 | Kubler et al. | 370/328 |
| 2005/0015531 A1 * | 1/2005 | Yabuta et al. | 710/100 |
| 2005/0027890 A1 * | 2/2005 | Nelson et al. | 709/250 |
| 2005/0138439 A1 * | 6/2005 | Rothman et al. | 713/300 |
| 2005/0254475 A1 * | 11/2005 | Kubler et al. | 370/338 |
| 2005/0265004 A1 * | 12/2005 | Coglitore et al. | 361/724 |
| 2005/0283549 A1 | 12/2005 | Gibson et al. | |
| 2005/0283815 A1 * | 12/2005 | Brooks et al. | 725/126 |
| 2006/0071845 A1 * | 4/2006 | Stroili et al. | 342/13 |
| 2006/0140211 A1 * | 6/2006 | Huang et al. | 370/466 |
| 2006/0190484 A1 * | 8/2006 | Cromer et al. | 707/104.1 |
| 2006/0259797 A1 * | 11/2006 | Fung | 713/300 |
| 2007/0025478 A1 * | 2/2007 | Koga | 375/345 |
| 2007/0050644 A1 | 3/2007 | Merkin | |
| 2007/0121940 A1 * | 5/2007 | Park et al. | 380/201 |
| 2007/0169106 A1 * | 7/2007 | Douglas et al. | 717/173 |
| 2007/0174686 A1 * | 7/2007 | Douglas et al. | 714/13 |
| 2007/0177584 A1 * | 8/2007 | Kubler et al. | 370/352 |
| 2007/0201413 A1 * | 8/2007 | Laine et al. | 370/338 |
| 2007/0201515 A1 * | 8/2007 | Lewis | 370/502 |
| 2007/0245165 A1 * | 10/2007 | Fung | 713/320 |
| 2008/0025235 A1 * | 1/2008 | Mahany et al. | 370/256 |
| 2008/0025378 A1 * | 1/2008 | Mahany et al. | 375/150 |
| 2008/0165767 A1 * | 7/2008 | Kubler et al. | 370/353 |
| 2008/0172708 A1 * | 7/2008 | Perry et al. | 725/110 |
| 2008/0183927 A1 * | 7/2008 | Rofougaran | 710/106 |
| 2008/0288679 A1 * | 11/2008 | Bandholz et al. | 710/71 |
| 2009/0089842 A1 * | 4/2009 | Perry et al. | 725/78 |

* cited by examiner

DUAL-BAND COMMUNICATION OF MANAGEMENT TRAFFIC IN A BLADE SERVER SYSTEM

BACKGROUND OF THE INVENTION

1. Field of the Invention

The present invention relates to rack-mount server systems, and more particularly to electronic communication between system components in rack-mount server systems.

2. Description of the Related Art

A rack-mount server system is a powerful, expandable, and customizable computer system in which multiple servers and other computing hardware are consolidated in a rack enclosure. Rack-mount server systems having one or more server racks are typically assembled in a controlled-environment "data center" for servicing the needs of a large organization, such as a company or an online web service. A blade server is one type of rack-mountable server that omits components such as a power supplies, cooling fans, and network switches to achieve a more compact form factor than other rack-mount servers. Multiple blade servers instead share system resources such as power, cooling and network connectivity provided by support modules in the blade server chassis. The compact form factor of a blade server results in an especially high-density system.

A management module is typically provided in the blade server chassis to manage the blade servers. "Management traffic" includes the electronic signals generated by and flowing between the management module and the servers, by which the management module controls the servers and the servers communicate information to the management module. In most systems, the management module communicates with the blade servers over a serial bus network, using communication protocols known in the art such as RS-485, RS232, I2C, SPI, and CAN. Though a point-to-point RS-485 communication link is capable of supporting relatively high-bandwidth management traffic on the order of 10 mbps or more, the actual bandwidth allocated for communication of management traffic over the RS-485 serial bus between the management module and each of the blade servers is typically constrained. For example, signal flow between any two nodes along the RS-485 bus may be electrically limited to a speed on the order of, for example, 250 kbps (kilobytes per second) due to the numerous loads the shared RS-485 bus is required to simultaneously support. This signal flow may be further limited to an effective speed as low as, for example, 1 kbps, due to additional communication protocols that may be implemented, such as for error checking, collision detection, and so forth.

The constrained bandwidth available for communicating management traffic over an RS-485 serial bus network is suitable for certain types of management traffic, such as power on/off, reset, and monitoring of environmental parameters. However, computing technology has evolved to include increasingly high-bandwidth electronic signals, and higher-bandwidth management traffic such as flash updates and video are generally not practical on existing RS-485 serial buses. For example, flash devices rated between 8 MB to 256 MB would require between about 0.5 to 17 minutes or more to flash update at a speeds of 250 kbps. One approach to overcoming this limitation has been to piggyback some of the management traffic across a higher-bandwidth Ethernet connection. However, this solution requires an Ethernet switch to be installed and functional.

SUMMARY OF THE INVENTION

One embodiment provides a communication system for a multi-blade server system includes a multi-drop serial bus network interconnecting a management module with each of a plurality of servers in a multi-server chassis. A first transceiver subsystem is configured for communicating over the serial bus network between the management module and each server within a first frequency band. A second transceiver subsystem is configured for simultaneously communicating over the serial bus network between the management module and the servers within a second frequency band higher than the first frequency band. A first signal-filtering subsystem substantially filters out signals in the second frequency band from the first transceiver subsystem. A second signal-filtering subsystem substantially filters out the signals in the first frequency band from the second transceiver subsystem.

Another embodiment provides a method wherein some signals are communicated over a multi-drop serial bus network between a management module and a plurality of servers within a first frequency band, while other signals are simultaneously communicated over the serial bus network between the management module and the servers within a second frequency band that is higher than the first frequency band. The signals in the first frequency band are electronically separated from the signals in the second frequency band at each of the servers and at the management module.

Other details and embodiments will be described in the following description and the appended claims.

DETAILED DESCRIPTION OF PREFERRED EMBODIMENTS

Embodiments of the invention include a communication system and method in which all management traffic between a management module and a plurality of nodes may be communicated over an existing serial bus network, rather than diverting higher-bandwidth management over a separately managed Ethernet connection. For example, one embodiment provides a communication system including a serial bus network that communicates lower-bandwidth management traffic using the RS-485 link established on the serial bus network, while simultaneously communicating the higher-bandwidth management traffic (e.g. video and flash update instructions) on a separate frequency band over the same serial-bus network. The plurality of nodes is capable of communicating on the RS-485 link, and at least a subset of the plurality of nodes is also capable of communicating at a higher-bandwidth over the same serial bus network. The subset of nodes may include any number of the nodes, from one node to all of the plurality of nodes. The communication system selectively filters the management traffic to electronically separate the higher-bandwidth management traffic from the lower-bandwidth management traffic communicated across the shared serial bus network as it is received at each server and at the management module.

Another embodiment of the invention provides a server system having such a communication system. Accordingly, management traffic flows between the management module and the servers without the need to convey the higher-bandwidth management traffic over a separately managed Ethernet connection. Implementing such a communication system in a server system may provide backward compatibility with older servers that are capable of communicating on the RS-485 link but not the 802.11 link, allowing both new and existing servers to coexist in a chassis. Further details of some exemplary embodiments and applications thereof are provided below, with reference to the accompanying figures.

Figure 1:
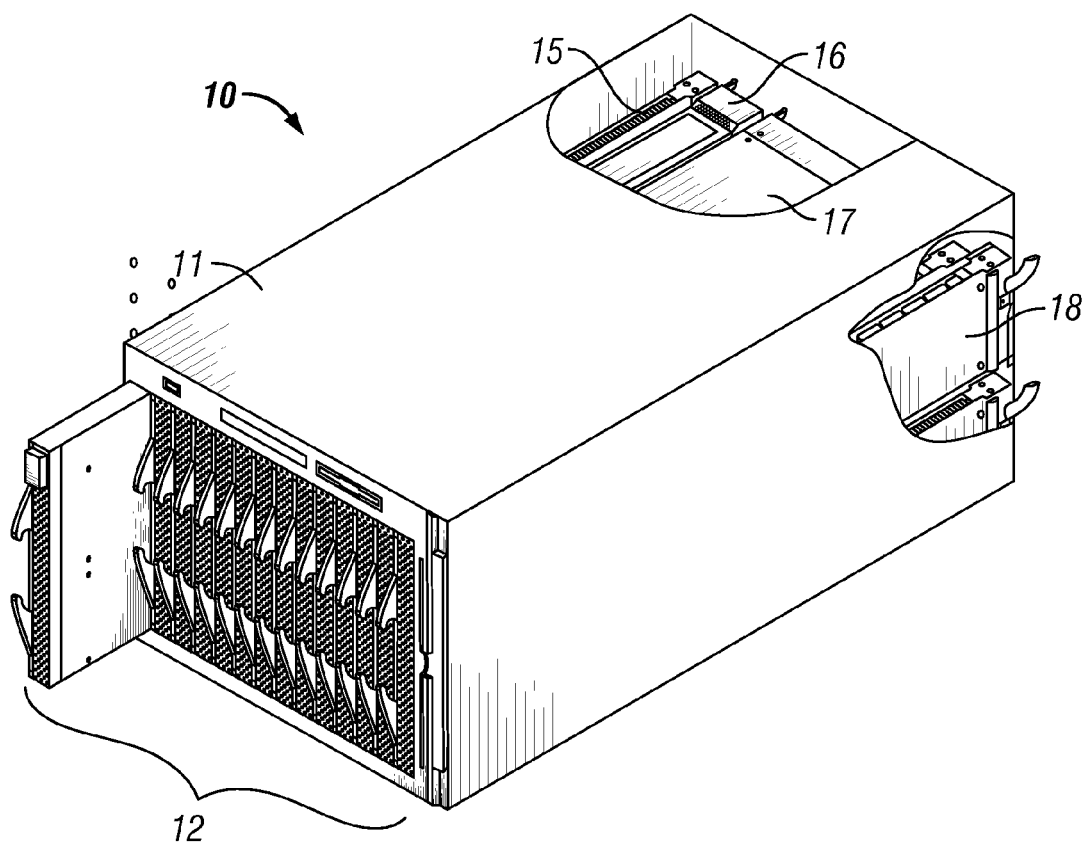
FIG. 1 is a perspective view of an exemplary blade server system in which an improved communication system is implemented according to one or more embodiments of the invention.

FIG. 1 is a perspective view of an exemplary blade server system 10 in which an improved communication system is implemented according to one or more embodiments of the invention. The blade server system 10 includes a plurality of blade servers generally indicated at 12, received in a multi-blade chassis 11 along with supporting hardware devices. Fourteen blade servers 12 are shown in this embodiment by way of example, although a multi-blade chassis in the context of the invention may be configured to house any number of the blade servers 12. Each blade server 12 may include one or more microprocessors, hard drives, and memory to service one or more common or independent networks. Each blade server 12 also includes a baseboard management controller (BMC), which is a specialized microcontroller embedded in the motherboard whose functionality may include receiving input from different sensors and sending an alert to the administrator if any parameters do not stay within predefined limits. The blade server system 10 includes a variety of shared support modules known in the art, including a chassis management module ("MM") 15, one or more power supply modules 16, one or more blower modules 17, and multiple switch modules 18 such as an Ethernet switch that provide network connectivity between the blade server I/O and the network. The management module 15 manages the chassis, blade servers, and other modules. A serial bus network schematically shown at 30 provides communication between the management module 15 and each blade server 12.

Figure 2:
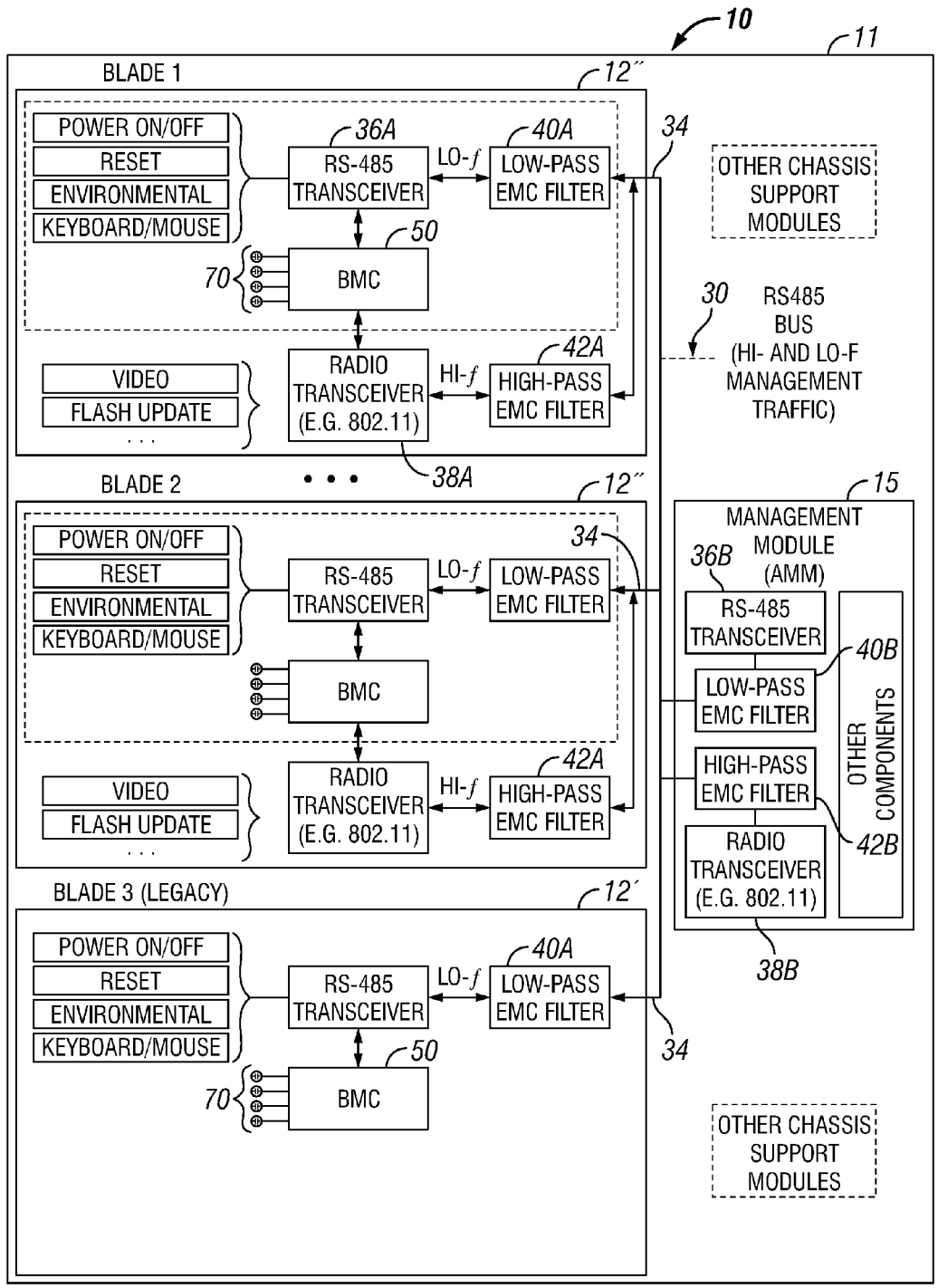
FIG. 2 is a schematic diagram of the blade server system of FIG. 1, as configured with a communication system according to one exemplary embodiment of the invention.

FIG. 2 is a schematic diagram of the blade server system 10, as configured with a communication system according to one exemplary embodiment of the invention. Three blade servers are shown in FIG. 2, including a "single-band" blade server 12' and two "dual band" blade servers 12". The blade servers 12' and 12" may have substantially similar exterior dimensions for removably inserting in a standard size bay of the chassis 11 and interchangeably interfacing with the blade server system 10. The communication system includes a multi-drop serial bus network generally indicated at 30. The serial bus network 30 includes a bus 32 with multiple drops 34 for communicating two-way management traffic between each of the blade servers 12' and 12" and the management module 15.

At least two different, independently operable communications links coexist on the serial bus network 30 for selectively communicating the two-way management traffic between the blade servers 12', 12" and the management module 15. The first communication link operates in the base band according to a communication protocol, such as RS-485, RS232, I2C, SPI, and CAN (RS-485 is used by way of example in the discussion below). The second communication link operates in a higher frequency band according to a multipoint high frequency, high bandwidth radio protocol, such as an 802.11 protocol. The single-band blade server 12' may be a conventional ("legacy") blade server configured for communicating management traffic only according to the RS-485 protocol, and the new, dual-band blade servers 12" are capable of communicating management traffic on either or both the lower-band RS-485 and higher-band 802.11 protocols simultaneously. The management module 15 is configured for communicating with both the new, dual-band blade servers 12" over the RS-485 and 802.11 links simultaneously. The management module 15 is also "backward compatible" to communicate with the single-band, legacy blade server 12' on the RS-485 link alone.

The serial bus network includes a first subsystem of transceivers used to establish the lower-frequency, RS-485 link between each of the blade servers 12', 12" and the management module 15, and a second subsystem of transceivers to establish the higher-frequency, 802.11 link between the blade server 12" and the management module 15, over the serial bus network 30. The first subsystem of transceivers includes an RS-485 transceiver 36A coupled to each of the single-band blade server 12' and the dual-band blade servers 12" and an RS-485 transceiver 36B coupled to the management module 15. Each RS-485 transceiver 36A forms a first "transceiver pair" with the RS-485 transceiver 36B for communicating management traffic comprising a first set of one or more electronic signals between the blade servers 12', 12" and the management module 15 using the RS-485 protocol. The second subsystem of transceivers includes a radio-frequency transceiver 38A coupled to each dual-band blade server 12" and a radio-frequency transceiver 38B coupled to the management module 15. The radio-frequency transceivers 38A, 38B communicate on one or more selected frequencies in the radio frequency range. For example, one suitable operational frequency for the radio-frequency transceivers 38A, 38B is 2.4 GHz. The radio-frequency transceivers 38A, 38B in this embodiment can therefore communicate at a transmission rate as high as about 22 Mbs using the 802.11 protocol (or variant thereof), and for that reason may alternatively be referred to as "802.11 transceivers" 38A, 38B. Each 802.11 transceiver 38A coupled to the respective dual-band blade server 12 forms a second transceiver pair with the 802.11 transceiver 38B coupled to the management module 15 for communicating additional management traffic in the form of a second set of electronic signals between the respective dual-band blade server 12" and the management module 15.

Due to the above-noted bandwidth constraints of an RS-485 link generally present in a blade server system environment, the operational frequency of the RS-485 link may be limited to 125 kHz base band with up to 1125 kHz harmonics. The 802.11 link, operating in the typical 2.4 GHz radio frequency range with a typical channel width of 20 MHz, will provide a substantially higher bandwidth than RS-485 link, and can communicate management traffic at a higher data transfer rate. The management traffic may therefore be parsed into lower-bandwidth components for communicating on the lower-bandwidth RS-485 link in the form of the first set of electronic signals, and higher-bandwidth components suitable for communicating on the higher-bandwidth 802.11 link in the form of the second set of electronic signals.

A signal filtering subsystem is used to separate components of the management traffic conveyed over the lower-frequency RS-485 link and components of the management traffic conveyed over the higher-frequency 802.11 link. Still referring to FIG. 2, a pair of low-pass electromagnetic compatibility ("EMC") filters 40A and 40B are provided to selectively filter signals communicated between the lower-frequency RS-485 transceivers 36A, 36B. The low-pass EMC filters 40A filters out frequencies above the operational frequency of the RS-485 link from the management traffic received by the RS-485 transceivers 40A at the respective blade servers 12' and 12". The low-pass EMC filter 40B filters out frequencies above the operational frequency of the RS-485 link from the management traffic received by the RS-485 transceiver 40B at the management module 15. Together, the low-pass EMC filters 40A and 40B allows the lower-frequency management traffic to pass easily between the blade servers 12', 12" and the management module 15 over the RS-485 link, while preventing interference from higher-frequency signals on the 802.11 link that are simultaneously carried over the serial bus network 30. Similarly, high-pass EMC filters 42A and 42B are provided to selectively filter signals communicated between the higher-frequency 802.11 transceivers 38A, 38B. The high-pass EMC filters 40A filters out frequencies below the operational frequency of the 802.11 link from the management traffic received by the 802.11 transceivers 42A at the respective blade servers 12". The high-pass EMC filter 42B filters out frequencies below the operational frequency of the 802.11 link from the management traffic received by the 802.11 transceiver 42B at the management module 15. Together, the high-pass EMC filters 42A and 42B allows the higher-frequency management traffic to pass easily between the blade servers 12" and the management module 15 over the 82.11 link, while preventing interference from lower-frequency signals on the RS-485 link that are simultaneously carried over the serial bus network 30.

A baseboard management controller (BMC) 50 is included with each blade server 12', 12". The BMC 50 is a specialized microcontroller embedded on the motherboard. The BMC 50 may manage the interface between system management software and platform hardware. Sensors 70 built into the computer system report to the BMC 50 on environmental parameters such as temperature, cooling fan speeds, power mode, and operating system (OS) status. The BMC 50 monitors the sensors 70 and can send alerts to the management module 15 for the attention of a system administrator if any of the parameters do not stay within preset limits, indicating a potential failure of the system. The administrator can also remotely communicate with the BMC 50 from the management module 15 over the serial bus network 30 to take some corrective action such as resetting or power cycling the system to get a hung OS running again. This communication between the BMC and the management module, such as to monitor environmental parameters and to perform power resetting and cycling, are examples of management traffic components that are generally suitable for transmission over the relatively low-bandwidth RS-485 link. Thus, each BMC 50 is coupled to the RS-485 transceiver 36A on the respective blade server 12' and 12" to provide communication of these management traffic components between the BMC 50 and the management module 15 over at least the RS-485 link. Thus, management traffic flowing over the RS-485 link and management traffic flowing over the 802.11 link, the management traffic communicated between the management module and the blade servers over the RS-485 link may be referred to as a first set of management signals, and the management traffic communicated between the management module and the blade servers over the 802.11 link may be referred to as a second set of management signals.

Examples of bandwidths suitable for communication over the higher-bandwidth 802.11 link include video signals and flash updates. The BMC 50 may also be coupled to the 802.11 transceiver 48A on the dual-band blade servers 12" to optionally route other management traffic between the BMC 50 and the management module 15 being communicated over the 802.11 link. For example, the BMC 50 may route compressed video signals to the management module 15 from video display and compression hardware or flash updates from the management module 15 to one or more flash devices (not shown) over the 802.11 link. Alternatively, the management traffic routed over the 802.11 link between the management module 15 and the blade servers 12 may bypass the BMC 50 en route to these server components.

In the above embodiments, the RS-485 protocol was selected by way of example for conveying lower-bandwidth management traffic because the RS-485 protocol is well known in the art apart from its inventive application disclosed herein. Conveniently, one or more embodiments of the present invention may be constructed, therefore, by adapting an existing server platform having an RS-485 architecture, as opposed to a more complex top-down redesign. However, it should be noted that embodiments of the invention are not limited to using the RS-485 protocol for communicating lower-bandwidth management traffic over the serial bus network. For example, another embodiment may instead use a controller area network ("CAN") protocol in lieu of the RS-485 protocol for conveying lower-bandwidth management traffic.

Likewise, the 802.11 protocol and the frequency of 2.4 GHz were selected by way of example for conveying higher-bandwidth management traffic because the 802.11 protocol is also well known in the art apart from its inventive application disclosed herein. The 802.11 protocol(s) is particularly desirable because it is operable in a frequency range sufficiently higher than that of the RS-485 link, to facilitate reliable separation of higher bandwidth and lower-bandwidth management traffic. Furthermore, the 2.4 GHz spectrum was selected as a highly compatible frequency for use with the 802.11 protocol. However, it should be noted that embodiments of the invention are not limited to using the 802.11 protocol(s) at frequencies of 2.4 GHz. Other frequencies in the radio-frequency spectrum could also provide sufficient separation via the signal filtering techniques described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A communication system for a rack-mount server system, comprising:
   a serial bus network interconnecting a management module with each of a plurality of blade servers in a multi-server chassis;

in each blade server, a first transceiver subsystem configured to independently communicate lower-bandwidth management traffic over the serial bus network between the management module and the blade server within a first frequency band and a second transceiver subsystem configured to communicate higher bandwidth management traffic over the serial bus network between the management module and the blade server within a second frequency band simultaneously with the first transceiver subsystem communicating the lower-bandwidth management traffic over the serial bus network between the management module and the blade server within the first frequency band; and a signal-filtering subsystem configured to selectively filter the management traffic to electronically separate the higher-bandwidth management traffic from the lower-bandwidth management traffic.

2. The communication system of claim 1, wherein the first transceiver subsystem comprises a lower-frequency transceiver included with each blade server and a lower-frequency transceiver included with the management module configured to communicate with the lower-frequency transceiver included with each blade server.

3. The communication system of claim 2, wherein the second transceiver subsystem comprises a higher-frequency transceiver included with the at least one dual-band blade server and a higher-frequency transceiver included with the management module configured to communicate with the higher-frequency transceiver included with the at least one dual-band blade server.

4. The communication system of claim 1, wherein the signal-filtering subsystem comprises a low-pass filter included with each blade server to filter out signals in the higher-frequency band sent by the management module to the at least one dual-band blade servers and a low-pass filter included with the management module to filter out signals in the higher-frequency band sent by the at least one dual-band blade server to the management module.

5. The communication system of claim 1, wherein the signal-filtering subsystem comprises a high-pass filter included with each-the at least one dual-band blade server to filter out signals in the lower-frequency band sent by the management module to the respective blade servers and a high-pass filter included with the management module to filter out signals in the lower-frequency band sent by the respective blade server to the management module.

6. The communication system of claim 1, wherein the first transceiver subsystem communicates using the RS-485 protocol.

7. The communication system of claim 6, wherein the lower-frequency band on which the first transceiver subsystem communicates is less than or equal to about 1125 kHz.

8. The communication system of claim 1, wherein the transmission rate at which the first transceiver subsystem communicates is no greater than about 250 kbps.

9. The communication system of claim 8, wherein the second transceiver subsystem communicates using a multi-point, radio protocol.

10. The communication system of claim 8, wherein the higher frequency band on which the second transceiver subsystem communicates is about 2.4 GHz.

11. The communication system of claim 8, wherein the transmission rate at which the second transceiver subsystem communicates is about 22 Mbs.

12. The communication system of claim 1, further comprising: a baseboard management controller provided on each blade server, wherein the signals in the first frequency band are routed to the baseboard management controller.

13. The communication system of claim 12, wherein the signals in the second frequency band received by the blade servers are routed to the baseboard management controller.

14. The communication system of claim 1, wherein the management traffic communicated by the first transceiver subsystem comprises a first set of management signals representative of a temperature, a cooling fan speed, a power mode, an operating system (OS) status, or a combination thereof.

15. The communication system of claim 1, wherein the management traffic communicated by the first transceiver subsystem comprises power-cycling instructions or power reset instructions generated by the management module.

16. The communication system of claim 1, wherein the management traffic communicated by the second transceiver subsystem comprises a second set of management signals including video signals or flash update instructions.

* * * * *